(12) United States Patent
Cheng et al.

(10) Patent No.: US 8,926,761 B2
(45) Date of Patent: Jan. 6, 2015

(54) PHOTOVOLTAIC MODULE CLEANER

(75) Inventors: Long Cheng, Perrysburg, OH (US);
Jigish Trivedi, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 696 days.

(21) Appl. No.: 13/198,834

(22) Filed: Aug. 5, 2011

(65) Prior Publication Data
US 2012/0031428 A1 Feb. 9, 2012

Related U.S. Application Data

(60) Provisional application No. 61/371,508, filed on Aug. 6, 2010.

(51) Int. Cl.
| | |
|---|---|
| *B08B 7/00* | (2006.01) |
| *H01L 31/068* | (2012.01) |
| *B08B 1/04* | (2006.01) |
| *H01L 31/0296* | (2006.01) |
| *H01L 31/0392* | (2006.01) |
| *H01L 31/048* | (2014.01) |
| *H01L 31/073* | (2012.01) |
| *H01L 31/18* | (2006.01) |

(52) U.S. Cl.
CPC ............. *H01L 31/068* (2013.01); *B08B 1/04* (2013.01); *H01L 31/0296* (2013.01); *H01L 31/03925* (2013.01); *H01L 31/048* (2013.01); *H01L 31/073* (2013.01); *H01L 31/1836* (2013.01); *Y02E 10/543* (2013.01); *Y02E 10/547* (2013.01)
USPC .................................................. 134/6; 134/4

(58) Field of Classification Search
None
See application file for complete search history.

(56) References Cited

U.S. PATENT DOCUMENTS

| | | | |
|---|---|---|---|
| 6,170,110 B1 * | 1/2001 | Svirchevski et al. ............. | 15/77 |
| 6,365,531 B1 | 4/2002 | Hayashi et al. | |
| 2008/0230120 A1 * | 9/2008 | Reddy ........................... | 136/260 |
| 2009/0223539 A1 | 9/2009 | Gibbel | |

* cited by examiner

*Primary Examiner* — Eric Golightly
(74) *Attorney, Agent, or Firm* — Dickstein Shapiro LLP

(57) ABSTRACT

The present invention relates to methods for cleaning semiconductors used in photovoltaic cells and modules, and methods for manufacturing p-n junctions for photovoltaic cells and modules. More particularly, the method comprises providing at least one semiconductor layer of a photovoltaic module and scrubbing the surface of the least one semiconductor layer in the presence of a chemical solution.

25 Claims, 3 Drawing Sheets

PHOTOVOLTAIC MODULE CLEANER

CROSS-REFERENCE TO RELATED APPLICATION

This application claims the benefit of U.S. Provisional Patent Application No. 61/371,508, filed Aug. 6, 2010, which is incorporated herein by reference in its entirety.

TECHNICAL FIELD

The present invention relates to methods for cleaning semiconductors in photovoltaic modules and methods for manufacturing p-n junctions for photovoltaic modules.

BACKGROUND

Photovoltaic modules convert solar energy into electricity. The efficiency of the conversion process is affected by the p-n junction within the module. The cleanliness of the semiconductor surfaces forming the p-n junction can have a significant impact on conversion efficiency. By removing surface contaminants, such as organic residues, the efficiency of the resulting module can be improved.

DETAILED DESCRIPTION

Figure 1:
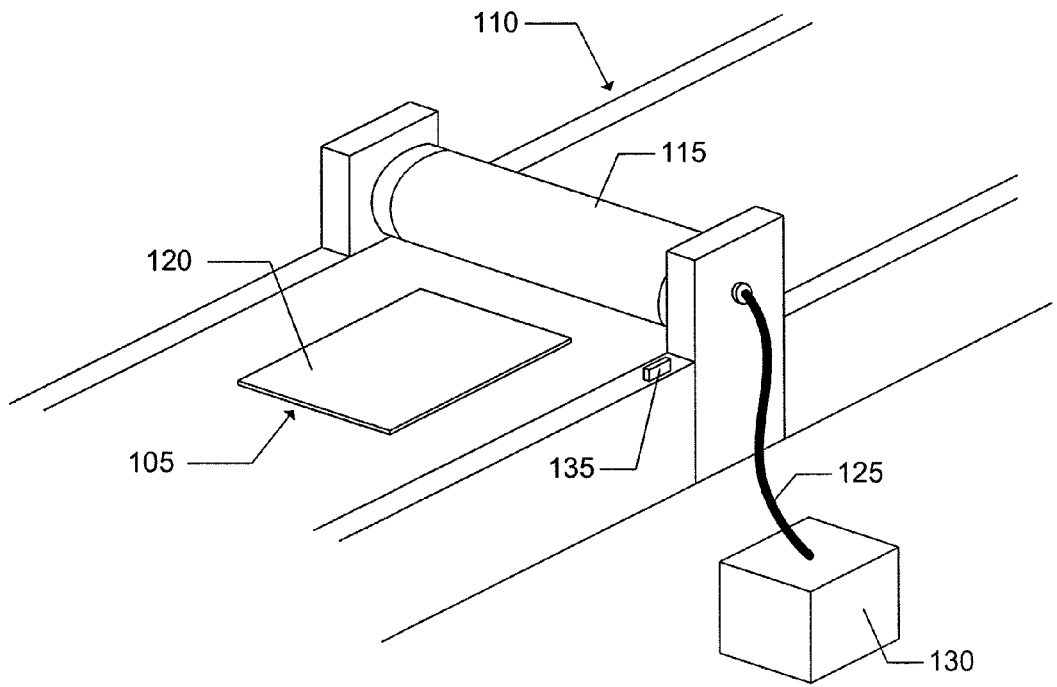
FIG. 1 is a perspective view of a mechanical and chemical cleaning process.

Photovoltaic modules convert solar energy into electricity. The conversion efficiency of a photovoltaic module is affected by many aspects of its design and construction. In particular, the module's p-n junction greatly affects its conversion efficiency. The performance of the p-n junction is reduced by surface contaminants on the mating surfaces of the semiconductors. Surface contaminants, such as organic residues, may form on the semiconductor surfaces during the manufacturing process. Since these residues reduce conversion efficiency, it is desirable to remove them prior to assembly of the module.

Laboratory testing revealed that mechanical scrubbing in the presence of a chemical solution effectively increased a photovoltaic cell's efficiency. Testing also demonstrated that using a chemical solution alone was ineffective at improving efficiency. Therefore, to improve the cell's efficiency, mechanical scrubbing must accompany the chemical solution.

In one aspect, a method for preparing a semiconductor for a photovoltaic module, can include providing a semiconductor layer and applying a chemical solution to a surface of the semiconductor layer. The method can include scrubbing the surface of the semiconductor layer with a scrubber in the presence of the chemical solution. The scrubbing duration can be about 0.1 minutes to about 60 minutes. The scrubbing duration can be about 0.5 minutes to about 10 minutes. The scrubbing duration can be about 1 minute to about 20 minutes. The scrubbing duration can be about 2 minutes to about 12 minutes. The pressure between the scrubber and the surface of the semiconductor layer is about 0.5 kPa to about 150 kPa. The pressure between the scrubber and the surface of the semiconductor layer is about 3 kPa to about 35 kPa.

The chemical solution can include detergent. The chemical solution can include soap. The chemical solution can include distilled water. The chemical solution can be applied to the surface of the semiconductor layer by immersing the semiconductor layer in the chemical solution. The chemical solution can be applied to the surface of the semiconductor layer through the scrubber. The chemical solution can be applied to the surface of the semiconductor layer through a spray nozzle. The chemical solution can be applied to the surface of the semiconductor layer at a flow rate of about 1 liter/minute to about 100 liters/minute. The chemical solution can be applied to the surface of the semiconductor layer at a flow rate of about 5 liters/minute to about 20 liters/minute. The semiconductor layer can include cadmium telluride. The semiconductor layer can include copper indium gallium selenide.

In another aspect, a method of manufacturing a p-n junction for a photovoltaic module can include providing a first semiconductor layer and scrubbing a surface of the first semiconductor layer with a scrubber in the presence of a chemical solution. The method can include providing a second semiconductor layer and scrubbing a surface of the second semiconductor layer with a scrubber in the presence of the chemical solution. The method can include placing the surface of the first semiconductor layer adjacent to the surface of the second semiconductor layer to form a p-n junction.

Scrubbing the surface of the first semiconductor layer has a duration of about 0.1 minute to about 60 minutes, and wherein scrubbing the surface of the second semiconductor layer has a duration of about 0.1 minute to about 60 minutes. Scrubbing the surface of the first semiconductor layer has a duration of about 0.5 minutes to about 10 minutes, and wherein scrubbing the surface of the second semiconductor layer has a duration of about 0.5 minutes to about 10 minutes. The pressure between the scrubber and the surface of the first semiconductor layer during scrubbing is about 0.5 kPa to about 150 kPa, and wherein the pressure between the scrubber and the surface of the second semiconductor layer during scrubbing is about 0.5 kPa to about 150 kPa. The pressure between the scrubber and the surface of the first semiconductor layer during scrubbing is about 3 kPa to about 35 kPa, and wherein the pressure between the scrubber and the surface of the second semiconductor layer during scrubbing is about 3 kPa to about 35 kPa.

The chemical solution can be applied to the surface of the first semiconductor layer by immersing the first semiconductor layer in the chemical solution. The chemical solution can be applied to the surface of the second semiconductor layer by immersing the second semiconductor layer in the chemical solution. The chemical solution can be applied to the surface of the first semiconductor layer through the scrubber. The chemical solution can be applied to the surface of the second semiconductor layer through the scrubber. The chemical solution can be applied to the surface of the first semiconductor layer through a spray nozzle. The chemical solution can be applied to the surface of the second semiconductor layer through the spray nozzle.

The chemical solution can be applied to the surface of the first semiconductor layer at a flow rate of about 0.1 liter/minute to about 100 liters/minute. The chemical solution can be applied to the surface of the second semiconductor layer at a flow rate of about 0.1 liter/minute to about 100 liters/minute.

The chemical solution can be applied to the surface of the first semiconductor layer at a flow rate of about 5 liters/minute to about 20 liters/minute. The chemical solution can be applied to the surface of the second semiconductor layer at a flow rate of about 5 liters/minute to about 20 liters/minute.

In another aspect, a semiconductor preparation apparatus can include a substrate position configured to accept a substrate comprising a semiconductor layer and a chemical solution applicator proximate to the substrate position and configured to apply a chemical solution to a surface of a semiconductor layer formed on a substrate positioned at the substrate position. The apparatus can include a scrubber proximate to the substrate position and configured to scrub a surface of a semiconductor layer formed on a substrate positioned at the substrate position. The scrubber can include a natural material. The scrubber can include a synthetic material. The scrubber can include a roller. The scrubber can include a pad. The scrubber can include polyvinyl alcohol.

A cleaning process may combine a mechanical process with a chemical process to prepare a semiconductor for use in a photovoltaic module. In particular, the cleaning process may introduce a chemical solution to the semiconductor while mechanically scrubbing the semiconductor. Scrubbing may include any suitable process for removing surface contaminants from the semiconductor such as, for example, rubbing, brushing, scouring, or polishing. Scrubbing may also include non-contact methods such as, for example, fluid jets that emit a cleansing fluid at a flow rate and pressure suitable to dislodge surface contaminants from the semiconductor.

Figure 2:
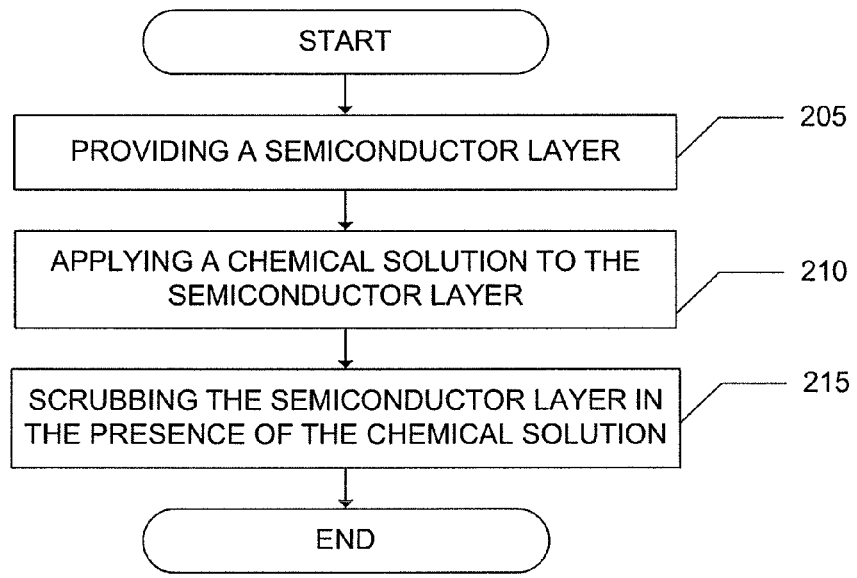
FIG. 2 is a flow chart of a method for preparing a semiconductor for use in a photovoltaic module.

As shown in FIG. 2, a method for preparing a semiconductor for a photovoltaic module may include providing a semiconductor layer 205, applying a chemical solution to the semiconductor layer 210, and scrubbing the semiconductor layer in the presence of the chemical solution. The semiconductor may be a crystalline or a thin film semiconductor and may contain, for example, silicon, cadmium sulfide, cadmium telluride, copper indium gallium selenide, copper indium selenide, gallium arsenide, gallium indium phosphide, or germanium.

The cleaning process may be manual or automated. If the process is automated, the semiconductor may travel on a conveyor system into a washing area, as shown in FIG. 1. The conveyor system 110 may include any suitable conveyor type such as a belt conveyor, roller conveyor, or chain conveyor. The conveyor system 110 may propel the semiconductor layer 105 under the scrubber 115. Alternately, the semiconductor layer 105 may remain stationary, and the scrubber may traverse the semiconductor layer 105. The scrubber 115 may rotate, oscillate, or reciprocate in contact with the semiconductor layer 105 to clean the semiconductor surface 120.

Figure 3:
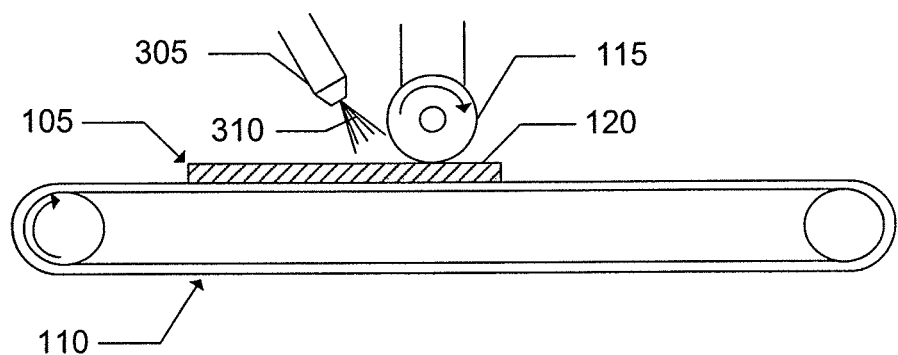
FIG. 3 is a side view of a mechanical and chemical cleaning process.
Figure 4:
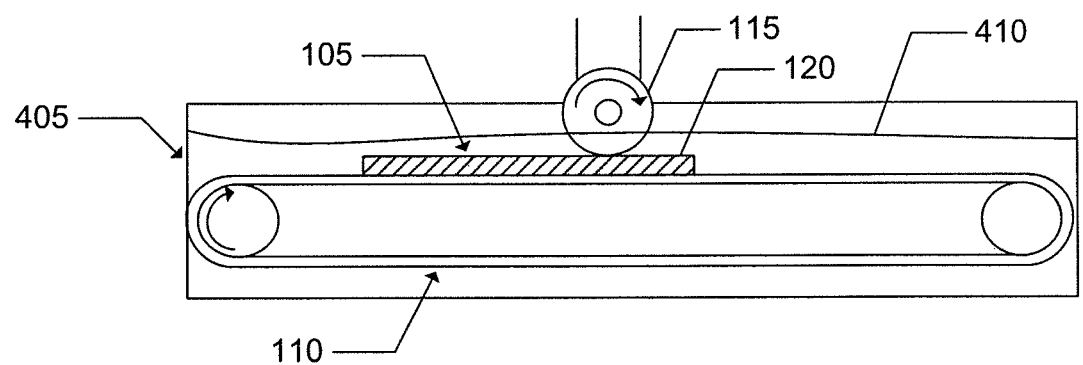
FIG. 4 is a side view of a mechanical and chemical cleaning process.

During the cleaning process, the chemical solution may be applied to the semiconductor surface 120 by any suitable method. For example, the chemical solution 310 may be delivered through a spray nozzle 305 as shown in FIG. 3. Similarly, a drip system or a mister system may be employed. Alternately, the chemical solution may be delivered through the scrubber 115 itself as show in FIG. 1. In any case, the chemical solution may be applied at a flow rate of about 1 liter/minute to about 100 liters/minute. More preferably, the chemical solution may be applied at a flow rate of about 5 liters/minute to about 20 liters/minute. As another alternative, the chemical solution 410 may be housed in a container 405 into which the semiconductor 105 is immersed prior to or during the scrubbing process, as shown in FIG. 4. To enhance efficacy of the cleaning process, the container 405 may agitate the chemical solution 410 to encourage its movement across the semiconductor surface 120.

The chemical solution may include any suitable cleaning agent, washing agent, or polishing agent. The chemical solution may include alkaline washing agents, acidic washing agents, or neutral washing agents. The chemical solution may include detergent, soap, or water. The chemical solution may include mineral acids, chelants, sodium hydroxides, potassium hydroxides, organic solvents, or surfactants. The chemical solution may include abrasives (slurries) such as diamond, alumina, colloidal silica or other hard minerals and oxides of a variety of sizes (0.01~10 µm) and shapes. In addition to being suspended in the chemical solution, the abrasives may also be fixed on the scrubbers either by coating, bonding or other suitable ways.

The scrubber may be any suitable tool capable of scrubbing the semiconductor surface to remove contaminants. For example, the scrubber may be a roller, pad, brush, or wipe. The scrubber may be constructed of any suitable material. In particular, the material should be soft enough to avoid damaging the semiconductor surface during scrubbing while also being strong enough to avoid breaking down during use. A material that breaks down during use is undesirable since it leaves debris on the semiconductor surface. Scrubber materials that demonstrate sufficient durability and performance include synthetic materials (for example, polyvinyl alcohols (PVA), Nylon, polypropylenes, polyesters, polyurethanes, and other suitable synthetic materials.), natural materials (for example, Tampico fibers and horsehairs, any other suitable natural materials.) and the mixtures of these synthetic and natural materials.

Process parameters, such as duration and pressure, may be closely controlled. For example, the duration of the scrubbing process may be about 0.1 minute to about 60 minutes. More preferably, the scrubber may engage the semiconductor surface 120 for a duration of about 0.5 minutes to about 10 minutes, or about 1 minute to about 20 minutes, or about 2 minutes to about 12 minutes, or any other suitable duration. During the scrubbing process, scrubbing pressure must be closely monitored. Scrubbing pressure is measured between the scrubber and the semiconductor surface. Scrubbing pressure is equal to the force applied to the scrubber divided by the surface area of the scrubber. The scrubbing pressure must be high enough to promote removal of surface contaminants but must be low enough to avoid damaging the semiconductor surface or causing premature wear to the scrubber material. Laboratory testing confirmed that scrubbing pressures from about 0.1 to 20 psi or 0.5 kPa to 150 kPa are effective. In particular, pressures from about 0.5 to 5 psi or 3 kPa to 35 kPa were very effective at removing surface contaminants while also promoting longevity of the scrubber material.

If a discharge technique is used, the chemical solution may be discharged from outside or inside the scrubber material. FIG. 1 shows a cleaning process where the chemical solution is discharged from inside the scrubber material. In this configuration, the chemical solution may be pumped from a chemical delivery unit 130 to a scrubber 115 via a supply line 125. The scrubber 115 may contain a hollow core having perforations that allow the chemical solution to flow through the core to the outer material. In this way, the design is self-cleaning, since contaminants are flushed from the scrubber by the flowing chemical solution. Excess chemical solution may be captured, filtered, treated, and recycled back into the chemical delivery unit 130.

The cleaning system may include a vision system 135 to identify the presence of the semiconductor layer 105, thereby permitting the scrubber 115 and pump to power on when a semiconductor layer 105 is in the cleaning area and to power off when a semiconductor layer 105 is not present. When no semiconductor layer 105 is present, the cleaning system may execute a self-cleaning cycle to purge contaminants from the scrubber 115. For example, the flow rate of solution though the scrubber 115 may be increased for a short duration to expel contaminants from the scrubber 115.

If an immersion technique is used as shown in FIG. 4, the semiconductor 105 may be oriented horizontally on the conveyor 110 to reduce the amount of chemical solution 125 required to coat the semiconductor 105. Once in the bath 405, the semiconductor 105 may remain stationary or may continue traveling on the conveyor 110 at a predetermined speed. The scrubber 115 may be configured to scrub a semiconductor surface 120 while it soaks in the chemical bath. For example, the scrubber 115 may be a spinning roller that automatically lowers into contact with the semiconductor surface 120. The spinning action of the scrubber 115 in the presence of the chemical solution 125 may successfully remove surface contaminants from the semiconductor surface 120.

Although FIGS. 3 and 4 depict the rotation of the mechanical scrubber as clockwise, this is not limiting. The rotation of the scrubber may be either clockwise, counterclockwise, or a combination thereof. Alternately, the scrubber may be a pad that oscillates, reciprocates, or spins against the semiconductor surface 120. The pad may be any suitable shape such as round, oval, or rectangular and may be mounted to a movable arm capable of bringing the pad into contact with the semiconductor surface 120.

In addition to cleaning the semiconductor surfaces, it may also be desirable to improve flatness of the mating surfaces. By improving the flatness of the mating surfaces, the resulting p-n junction may achieve greater conversion efficiency. Flatness may be improved by adding a polishing agent to the chemical solution to form a chemical slurry. By scrubbing the semiconductor in the presence of the chemical slurry, a small amount of the semiconductor surface may be removed thereby resulting in a planar surface. Mating two planar surfaces to form the p-n junction may improve diffusion of electrons and holes across the junction.

Figure 5:
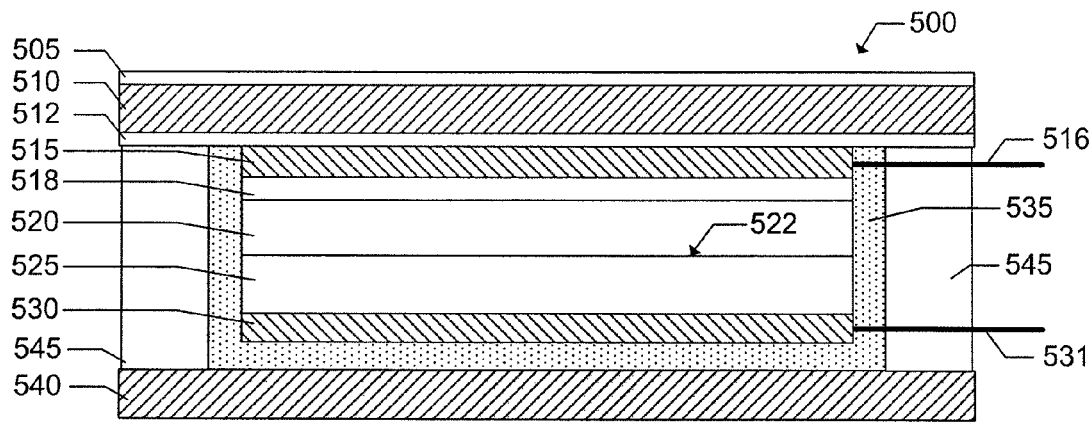
FIG. 5 is a side cross-sectional view of a photovoltaic cell.

Once the surfaces of the semiconductors have been cleaned as described above, they may be incorporated into a photovoltaic module as shown in FIG. 5. The photovoltaic cell 500 may include an anti-reflective coating 505 formed on a superstrate 510. The anti-reflective coating 505 may be designed to reduce reflection and increase transmission. For instance, reflections are minimized if the coating is approximately one-quarter-wavelength thick with respect to the wavelengths of incident photons. Since CdTe has a bandgap energy of 1.48 eV, the anti-reflective coating 505 may have a thickness of about 0.15 microns. The anti-reflective coating 505 may contain, for example, aluminum oxide, titanium dioxide, magnesium oxide, silicon monoxide, silicon dioxide, or tantalum pentoxide. Since the anti-reflective coating only optimizes transmission at a single wavelength, it may be desirable to modify the surface of the superstrate 510 to improve overall transmission. For instance, the superstrate 510 may be textured prior to adding the anti-reflective coating 505 to enhance light trapping.

The superstrate 510 may be formed from an optically transparent material such as soda-lime glass. Since quality and cleanliness of a glass superstrate can have a significant effect on performance of the module, polishing the glass with cerium oxide powder may be desirable to increase transmission. A barrier layer 512 may be formed adjacent to the superstrate 510 to lessen diffusion of sodium or other contaminants from the superstrate 510. The barrier layer 512 may include silicon dioxide or any other suitable material.

A transparent conductive oxide (TCO) layer 515 may be formed between the barrier layer 512 and a buffer layer 520 and may serve as a front contact for the photovoltaic module. In forming the TCO layer 515, it is desirable to use a material that is both highly conductive and highly transparent. For example, the TCO layer 515 may include tin oxide, cadmium stannate, or indium tin oxide. To further improve transparency, the TCO layer 515 may be about 1 micron thick. If cadmium stannate is used, application of the cadmium stannate may be accomplished by mixing cadmium oxide with tin dioxide using a 2:1 ratio and depositing the mixture onto the superstrate 510 using radio frequency magnetron sputtering. A buffer layer 518 may be formed between the TCO layer 515 and a n-type window layer 520 to decrease the likelihood of irregularities occurring during formation of the n-type window layer.

The n-type window layer 520 may include a very thin layer of cadmium sulfide. For instance, the n-type window layer 520 may be 0.1 microns thick and may be deposited using any suitable thin-film deposition technique. For example, the n-type window layer 520 may be deposited using a metal organic chemical vapor deposition (MOCVD). To reduce surface roughness of the n-type window layer 520, it may be annealed at approximately 400 degrees Celsius for about 20 minutes. The annealing process may improve the boundary between the n-type window layer 520 and the CdTe layer 525 by reducing defects. By reducing defects and improving the boundary, the efficiency of the photovoltaic module is improved.

The p-type absorber layer 525 may be formed adjacent to the n-type window layer 520 and may include cadmium telluride. The p-type absorber layer 525 may be deposited using any suitable deposition method. For instance, the p-type absorber layer 525 may be deposited using atmospheric pressure chemical vapor deposition (APCVD), sputtering, atomic layer epitaxy (ALE), laser ablation, physical vapor deposition (PVD), close-spaced sublimation (CSS), electrodeposition (ED), screen printing (SP), spray, or MOCVD. Following deposition, the p-type absorber layer 525 may be heat treated at a temperature of about 420 degrees Celsius for about 20 minutes in the presence of cadmium chloride, thereby improving grain growth and reducing grain boundary trapping effects on minority carriers. By reducing trapping effects within the p-type absorber layer 525, open-circuit voltage is increased.

A p-n junction 522 is formed where the p-type absorber layer 525 meets the n-type window layer 520. The p-n junction 522 contains a depletion region characterized by a lack of electrons on the n-type side of the junction and a lack of holes (i.e. electron vacancies) on the p-type side of the junction. The width of the depletion region is equal to the sum of the diffusion depths located on the p-type side and the n-type side. The respective lack of electrons and holes is caused by electrons diffusing from the n-type window layer 520 to the p-type absorber layer 525 and holes diffusing from the p-type absorber layer 525 to the n-type window layer 520. As a result of the diffusion process, positive donor ions are formed on the n-type side and negative acceptor ions are formed on the p-type side. The positive donor ions may be phosphorous atoms locked in a silicon lattice that have donated an electron, and the negative acceptor ions may be boron atoms locked in a silicon lattice that have gained an electron. The presence of a negative ion region near a positive ion region establishes a built-in electric field across the p-n junction 522. When the photovoltaic module 100 is exposed to sunlight, photons are absorbed within the junction region. As a result, photo-generated electron-hole pairs are created. Movement of the electron-hole pairs are influenced by the built-in electric field, which produces current flow. The current flow occurs between a first terminal 116 attached to the TCO layer 515 and a second terminal 531 attached to a back contact 531.

The back contact 530 may be formed adjacent to the p-type absorber layer 525. The back contact 530 may be a low-resistance ohmic contact that maintains good contact with the p-type absorber layer 525 throughout temperature cycling. To ensure stability of the contact, a rear surface of the p-type absorber layer 525 may be etched with nitric-phosphoric (NP) to create a layer of elemental Te on the rear surface, and the back contact 530 may cover the entire back surface of the p-type absorber layer 525. The back contact 530 may include aluminum applied through evaporation that is subsequently annealed. Alternately, the back contact 530 may include molybdenum or any other suitable low-resistance material.

Interlayer 535 can be formed adjacent to back contact 530 and may protect the layers from moisture and water ingress and may provide containment of potentially harmful materials if the photovoltaic module is physically damaged. The interlayer 535 may include a polymer material such as, for example, ethylene-vinyl acetate (EVA), but any other suitable material may be used. It should be noted that in some embodiments, interlayer 535 may not be disposed between back cover 140 and the layers formed adjacent to superstrate 510. For example, interlayer 535 can have a peripheral structure capable of contacting the sides of the layers formed adjacent to superstrate 510 (for example, a portion of the edge or the entire edge of the module) but not necessarily being disposed between the layers formed adjacent to superstrate 510 and back cover 540. The back cover 540 may be positioned adjacent to the layers formed adjacent to superstrate 510 (for example, back contact 530). The back cover glass 540 may be formed adjacent to the interlayer 535 and may further protect the rear side of the module. The protective back cover glass 540 may include, for example, soda-lime glass.

Figure 6:
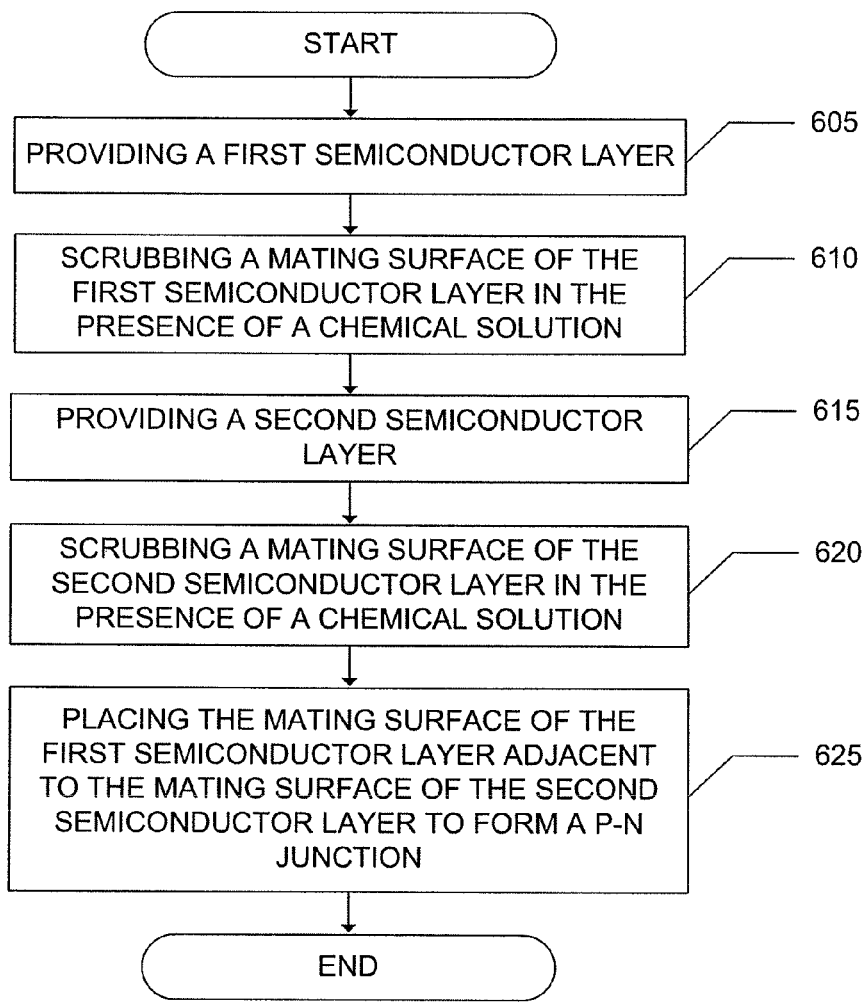
FIG. 6 is a flow chart of a method for manufacturing a p-n junction for use in a photovoltaic module.

As shown in FIG. 6, a method of manufacturing a p-n junction may include providing a first semiconductor layer 605 and scrubbing a mating surface of the first semiconductor layer in the presence of a chemical solution 610. The method may further include providing a second semiconductor layer 615 and scrubbing a mating surface of the second semiconductor layer in the presence of a chemical solution 620. The two mating surfaces can be scrubbed or processed in series, as shown in FIG. 6, or in parallel. Lastly, the method may include placing the mating surface of the first semiconductor layer adjacent to the mating surface of the second semiconductor layer to form a p-n junction 625.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. In particular, steps depicted in the figures may be executed in orders differing from the orders depicted. For example, steps may be performed concurrently or in alternate orders from those depicted. It should also be understood that the appended drawings are not necessarily to scale, presenting a somewhat simplified representation of various features and basic principles of the invention.

What is claimed is:

1. A method for preparing a semiconductor for a photovoltaic module, comprising:
   providing a semiconductor layer over a photovoltaic module substrate;
   applying a chemical solution to a surface of the semiconductor layer;
   scrubbing the surface of the semiconductor layer with a scrubber in the presence of the chemical solution; and
   providing a back contact adjacent to the scrubbed surface of the semiconductor layer.

2. The method of claim 1, wherein the scrubbing duration is about 0.1 minutes to about 60 minutes.

3. The method of claim 2, wherein the scrubbing duration is about 0.5 minutes to about 10 minutes.

4. The method of claim 1, wherein the pressure between the scrubber and the surface of the semiconductor layer is about 0.5 kPa to about 150 kPa.

5. The method of claim 4, wherein the pressure between the scrubber and the surface of the semiconductor layer is about 3 kPa to about 35 kPa.

6. The method of claim 1, wherein the chemical solution comprises detergent.

7. The method of claim 1, wherein the chemical solution comprises soap.

8. The method of claim 1, wherein the chemical solution comprises distilled water.

9. The method of claim 1, wherein the chemical solution is applied to the surface of the semiconductor layer by immersing the semiconductor layer in the chemical solution.

10. The method of claim 1, wherein the chemical solution is applied to the surface of the semiconductor layer through the scrubber.

11. The method of claim 1, wherein the chemical solution is applied to the surface of the semiconductor layer through a spray nozzle.

12. The method of claim 1, wherein the chemical solution is applied to the surface of the semiconductor layer at a flow rate of about 1 liter/minute to about 100 liters/minute.

13. The method of claim 12, wherein the chemical solution is applied to the surface of the semiconductor layer at a flow rate of about 5 liters/minute to about 20 liters/minute.

14. The method of claim 1, wherein the semiconductor layer comprises cadmium telluride.

15. The method of claim 1, wherein the semiconductor layer comprises copper indium gallium selenide.

16. A method of manufacturing a p-n junction for a photovoltaic module, the method comprising:
   providing a first semiconductor layer over a photovoltaic module substrate;
   scrubbing a surface of the first semiconductor layer with a scrubber in the presence of a chemical solution;
   providing a second semiconductor layer over the scrubbed surface of the first semiconductor layer to form a p-n junction;
   scrubbing a surface of the second semiconductor layer with a scrubber in the presence of the chemical solution; and
   placing a back contact over the scrubbed surface of the second semiconductor layer.

17. The method of claim 16, wherein scrubbing the surface of the first semiconductor layer has a duration of about 0.1 minute to about 60 minutes, and wherein scrubbing the surface of the second semiconductor layer has a duration or about 0.1 minute to about 60 minutes.

18. The method of claim 17, wherein scrubbing the surface of the first semiconductor layer has a duration of about 0.5 minutes to about 10 minutes, and wherein scrubbing the surface of the second semiconductor layer has a duration of about 0.5 minutes to about 10 minutes.

19. The method of claim 16, wherein the pressure between the scrubber and the surface of the first semiconductor layer during scrubbing is about 0.5 kPa to about 150 kPa, and wherein the pressure between the scrubber and the surface of the second semiconductor layer during scrubbing is about 0.5 kPa to about 150 kPa.

20. The method of claim 19, wherein the pressure between the scrubber and the surface of the first semiconductor layer during scrubbing is about 3 kPa to about 35 kPa, and wherein the pressure between the scrubber and the surface of the second semiconductor layer during scrubbing is about 3 kPa to about 35 kPa.

21. The method claim 16, wherein the chemical solution is applied to the surface of the first semiconductor layer by immersing the first semiconductor layer in the chemical solution, and wherein the chemical solution is applied to the surface of the second semiconductor layer by immersing the second semiconductor layer in the chemical solution.

22. The method of claim 16, wherein the chemical solution is applied to the surface of the first semiconductor layer through the scrubber, and wherein the chemical solution is applied to the surface of the second semiconductor layer through the scrubber.

23. The method of claim 16, wherein the chemical solution is applied to the surface of the first semiconductor layer through a spray nozzle, and wherein the chemical solution is applied to the surface of the second semiconductor layer through the spray nozzle.

24. The method of claim 16, wherein the chemical solution is applied to the surface of the first semiconductor layer at a flow rate of about 0.1 liter/minute to about 100 liters/minute, and wherein the chemical solution is applied to the surface of the second semiconductor layer at a flow rate of about 0.1 liter/minute to about 100 liters/minute.

25. The method of claim 24, wherein the chemical solution is applied to the surface of the first semiconductor layer at a flow rate of about 5 liters/minute to about 20 liters/minute, and wherein the chemical solution is applied to the surface of the second semiconductor layer at a flow rate of about 5 liters/minute to about 20 liters/minute.

* * * * *